(12) United States Patent
Wintermantel

(10) Patent No.: US 10,520,584 B2
(45) Date of Patent: Dec. 31, 2019

(54) RADAR SYSTEM WITH OPTIMIZED STORAGE OF TEMPORARY DATA

(71) Applicant: Conti Temic microelectronic GmbH, Nürnberg (DE)

(72) Inventor: Markus Wintermantel, Lindau (DE)

(73) Assignee: Continental Automotive Systems, Inc., Auburn Hills, MI (US)

(*) Notice: Subject to any disclaimer, the term of this patent is extended or adjusted under 35 U.S.C. 154(b) by 234 days.

(21) Appl. No.: 15/316,417

(22) PCT Filed: Jun. 2, 2015

(86) PCT No.: PCT/DE2015/200339
§ 371 (c)(1),
(2) Date: Dec. 6, 2016

(87) PCT Pub. No.: WO2015/185058
PCT Pub. Date: Dec. 10, 2015

(65) Prior Publication Data
US 2017/0153316 A1  Jun. 1, 2017

(30) Foreign Application Priority Data

Jun. 5, 2014  (DE) .................. 10 2014 210 769

(51) Int. Cl.
| | |
|---|---|
| *G01S 7/292* | (2006.01) |
| *G01S 13/34* | (2006.01) |
| *G01S 13/93* | (2006.01) |
| *H03M 7/30* | (2006.01) |
| *H03M 7/24* | (2006.01) |

(52) U.S. Cl.
CPC .......... *G01S 7/2923* (2013.01); *G01S 13/343* (2013.01); *G01S 13/931* (2013.01); *H03M 7/24* (2013.01); *H03M 7/30* (2013.01)

(58) Field of Classification Search
CPC .... G01S 7/2923; G01S 13/343; G01S 13/931; H03M 7/30
See application file for complete search history.

(56) References Cited

U.S. PATENT DOCUMENTS 3,836,964 A * 9/1974 Evans .................. G01S 7/2923
                                                   342/90
4,062,012 A * 12/1977 Colbert ................. G01S 7/2922
                                                   342/90
(Continued)

FOREIGN PATENT DOCUMENTS

| CN | 1502047 A | 6/2004 |
|---|---|---|
| CN | 102353955 A | 2/2012 |

(Continued)

OTHER PUBLICATIONS

International Search Report and Written Opinion dated Oct. 28, 2015 from corresponding International Patent Application No. PCT/EP2015/200339.
(Continued)

*Primary Examiner* — Peter M Bythrow

(57) ABSTRACT

The invention relates to a radar system for use in driver assistance systems in motor vehicles. According to the invention, the radar system has optimized storage of temporary data when using periodic linear frequency modulation and a multidimensional discrete Fourier transform.

18 Claims, 7 Drawing Sheets

(56) References Cited

U.S. PATENT DOCUMENTS

| | | | | |
|---|---|---|---|---|
| 4,206,461 A | * | 6/1980 | Pease | G01S 7/06 315/378 |
| 4,751,929 A | | 6/1988 | Hayakawa et al. | |
| 5,302,956 A | * | 4/1994 | Asbury | G01S 7/023 342/196 |
| 5,485,160 A | * | 1/1996 | Suganuma | G01S 7/412 342/189 |
| 5,850,202 A | * | 12/1998 | Goodman | G01S 7/023 342/25 A |
| 6,380,883 B1 | * | 4/2002 | Bell | B60Q 1/0023 342/70 |
| 2003/0156054 A1 | * | 8/2003 | Ishii | G01S 7/003 342/70 |
| 2006/0064206 A1 | * | 3/2006 | Merkel | G01S 13/931 701/1 |
| 2010/0085233 A1 | * | 4/2010 | Wintermantel | G01S 7/023 342/18 |
| 2011/0074620 A1 | * | 3/2011 | Wintermantel | G01S 7/032 342/70 |
| 2011/0099295 A1 | * | 4/2011 | Wegener | H03M 7/24 709/247 |
| 2011/0181459 A1 | * | 7/2011 | Feger | G01S 3/465 342/146 |
| 2012/0001791 A1 | * | 1/2012 | Wintermantel | G01S 7/023 342/109 |
| 2012/0004811 A1 | * | 1/2012 | Becker | B60R 21/013 701/45 |
| 2013/0148103 A1 | * | 6/2013 | Halmos | G01S 17/102 356/5.09 |
| 2014/0375491 A1 | * | 12/2014 | Roger | G01S 7/354 342/93 |
| 2015/0346321 A1 | * | 12/2015 | Jansen | G01S 7/02 342/107 |
| 2016/0033631 A1 | * | 2/2016 | Searcy | G01S 7/2806 342/132 |
| 2016/0041260 A1 | * | 2/2016 | Cao | G01S 7/282 342/129 |

FOREIGN PATENT DOCUMENTS

| | | |
|---|---|---|
| CN | 102356332 A | 2/2012 |
| CN | 102819017 A | 12/2012 |
| CN | 103634273 A | 3/2014 |
| DE | 4427656 C1 | 11/1995 |
| JP | S61170442 U | 10/1986 |
| JP | 2003240845 A | 8/2003 |
| JP | 2012522972 A | 9/2012 |
| WO | 2010115418 A2 | 10/2010 |
| WO | 2014029260 A1 | 2/2014 |

OTHER PUBLICATIONS

Chinese Office Action dated Oct. 10, 2018 for corresponding Chinese Patent Application No. 201580029673.2.
Japanese Office Action dated Nov. 9, 2018 for corresponding Japanese Patent Application No. 2016-567908.
Chinese Office Action dated Sep. 4, 2018 for corresponding Chinese Patent Application No. 201580029673.2.

* cited by examiner

RADAR SYSTEM WITH OPTIMIZED STORAGE OF TEMPORARY DATA

The invention relates to a radar system for use in driver assistance systems in motor vehicles. According to the invention, the radar system has optimized storage of temporary data when using periodic linear frequency modulation and a multidimensional discrete Fourier transform.

Prior Art

Motor vehicles are increasingly being equipped with driver assistance systems that cover the surroundings by means of sensor systems and derive automatic vehicle reactions from the traffic situation detected in this manner and/or instruct (in particular warn) the driver, wherein a distinction is made between comfort functions and safety functions.

FSRA (Full Speed Range Adaptive Cruise Control) is the most important comfort function as far as present development is concerned. The vehicle adjusts the ego-velocity to the desired velocity predetermined by the driver if said adjustment is possible in the present traffic situation. Otherwise, the ego-velocity is automatically adjusted to the traffic situation.

Besides increased comfort, safety functions will be more and more important in future, wherein a reduction of the braking distance in emergency situations will probably play the most important role. The corresponding driver assistance functions range from prefilling the brake automatically for reducing brake latency via an improved Brake Assist System (BAS+) to autonomous emergency braking.

Nowadays, radar sensors are used in most driver assistance systems of the type described above. Said radar sensors reliably operate even in bad weather and are capable of measuring the range between objects as well as of directly measuring the relative velocity of the objects by means of the Doppler effect.

The design of the antenna as well as the frequency modulation are key for a high detection quality. The best results can thereby be achieved by antenna arrangements having several transmitting and/or receiving antennas and by a periodic sequence of many linear frequency ramps; the high volume of data occurring in this case is processed by means of a multidimensional Fourier transform, which does however require a high computing and storage capacity. The ongoing further developments in semiconductor technology are resulting in reductions in the costs of computing capacity more rapidly than for storage capacity due to higher cycles and more intelligent implementations, so that the proportion of storage capacity making up the sensor costs is increasing.

Problem, Solution and Advantages of the Invention

The problem of the invention is to reduce the storage capacity which is required for the multidimensional Fourier transform in antenna arrangements having several transmitting and/or receiving antennas and periodic linear frequency modulation.

The advantages of the invention result from reduced costs, reduced chip size and reduced power consumption due to the reduced memory size. Conversely, in the case of a predetermined memory size, the size of the multidimensional Fourier transform and thus the resolution capability and/or the integration gain of the signal processing and thus the sensor sensitivity can be increased.

The radar system for covering the surroundings of a motor vehicle preferably comprises transmitting means for the radiation of transmitting signals having one or more transmitting antennas, receiving means for the reception of transmitting signals reflected from objects having one or more receiving antennas, and signal processing means for processing the received signals, wherein the frequency of the radiated transmitting power is modulated such that it includes a sequence of K linear ramps of identical slope, the receiving signals of several combinations of transmitting and receiving antennas, (e.g. i) one transmitting antenna radiates transmitting power and at least two receiving antennas receive the reflected radiation or ii) n (n=1,2, ... N) transmitting antennas radiate transmitting power and one or more receiving antennas receive transmitting power), are acquired by mixing with an oscillator signal and sampling for each frequency ramp in a parallel manner and/or over P successive frequency ramps in each case (hereinafter called a frequency ramp group) in a serial manner (i.e. K/P-times), a first spectral analysis, e.g. in the form of a discrete Fourier transform (DFT), is calculated in each case over the sampled values for each frequency ramp and for each of the respective combinations of transmitting and receiving antenna in digital signal processing means, the results of this first spectral analysis are stored over the K frequency ramps for at least a part of its frequency control points, which constitute so-called range gates, thereafter a second spectral analysis, e.g. in the form of a DFT, is calculated over the stored values for each range gate and for each combination of transmitting and receiving antenna over the frequency ramps and/or frequency ramp groups, and the results thereof are further processed over the different combinations of transmitting and receiving antennas (e.g. with the aid of digital beam shaping by means of a third DFT), characterized in that the results of the first spectral analysis are stored in a compressed form in order to reduce the storage space, wherein the results of several combinations of transmitting and receiving antenna have the same scaling for each range gate and frequency ramp and/or frequency ramp group and this scaling therefore only has to be stored once, the values thus scaled are quantized to a lower bit number than that used in the signal processing (in particular during the spectral analyses) and are stored with this reduced bit number, and these compressed values are decompressed again prior to further processing (i.e. prior to the second spectral analysis).

The signal processing (in particular the spectral analyses) of the radar system can preferably operate in fixed-point arithmetic with a two's complement representation.

The joint scaling of values from the minimum number of bits thereof having the same value in each case as the most significant bit can be determined, and the number of front bits thus determined is deleted for scaling.

The joint scaling of the values as well as the scaled values and the values quantized to a lower bit number can preferably be encoded in a joint binary word, the bit count of which is preferably a power of two.

Different bit numbers can preferably be used for the scaled values encoded in a joint binary word. Advantageously, if a power of two is specified, the latter can be exploited in the best possible way for the bit count of said joint binary word.

A random number can preferably be added up prior to quantization of the scaled values. The quantization errors can therefore be advantageously at least approximately uncorrelated over the frequency ramps and/or frequency ramp groups and/or the different combinations of transmitting and receiving antenna.

Consideration can preferably be given to the fact that as a result of adding a random number prior to quantization or as a result of rounding, the scaling may have to be amended.

The results of several combinations of transmitting and receiving antennas can preferably have the same scaling for several, preferably two, adjacent range gates for each frequency ramp and/or frequency ramp group. Therefore, this scaling advantageously only has to be stored once.

A different sensitivity of different combinations of transmitting and receiving antennas can preferably be compensated for prior to compressing in the digital signal processing means.

The discrete Fourier transforms (DFTs) can preferably be determined by means of fast Fourier transforms (FFTs).

The method for a radar system for covering the surroundings of a motor vehicle can preferably comprise transmitting means for the radiation of transmitting signals having one or more transmitting antennas, receiving means for the reception of transmitting signals reflected from objects having one or more receiving antennas, and signal processing means for processing the received signals, wherein the frequency of the radiated transmitting power is modulated such that it includes a sequence of K linear ramps of identical slope, the receiving signals of several combinations of transmitting and receiving antennas, (e.g. i) one transmitting antenna radiates transmitting power and at least two receiving antennas receive the reflected radiation or ii) n (n=1,2, ... N) transmitting antennas radiate transmitting power and one or more receiving antennas receive transmitting power), are acquired by mixing with an oscillator signal and sampling for each frequency ramp in a parallel manner and/or over P successive frequency ramps in each case (hereinafter called a frequency ramp group) in a serial manner (i.e. K/P-times), a first spectral analysis, e.g. in the form of a discrete Fourier transform (DFT), is calculated in each case over the sampled values for each frequency ramp and for each of the respective combinations of transmitting and receiving antenna in digital signal processing means, the results of this first spectral analysis are stored over the K frequency ramps for at least a part of its frequency control points, which constitute so-called range gates, thereafter a second spectral analysis, e.g. in the form of a DFT, is calculated over the stored values for each range gate and for each combination of transmitting and receiving antenna over the frequency ramps and/or frequency ramp groups, and the results thereof are further processed over the different combinations of transmitting and receiving antennas (e.g. with the aid of digital beam shaping by means of a third DFT), characterized in that the results of the first spectral analysis are stored in a compressed form in order to reduce the storage space, wherein the results of several combinations of transmitting and receiving antenna have the same scaling for each range gate and frequency ramp and/or frequency ramp group and this scaling therefore only has to be stored once, the values thus scaled are quantized to a lower bit number than that used in the signal processing (in particular during the spectral analyses) and are stored with this reduced bit number, and these compressed values are decompressed again prior to further processing (i.e. prior to the second spectral analysis).

EMBODIMENT EXAMPLE

Figure 1:
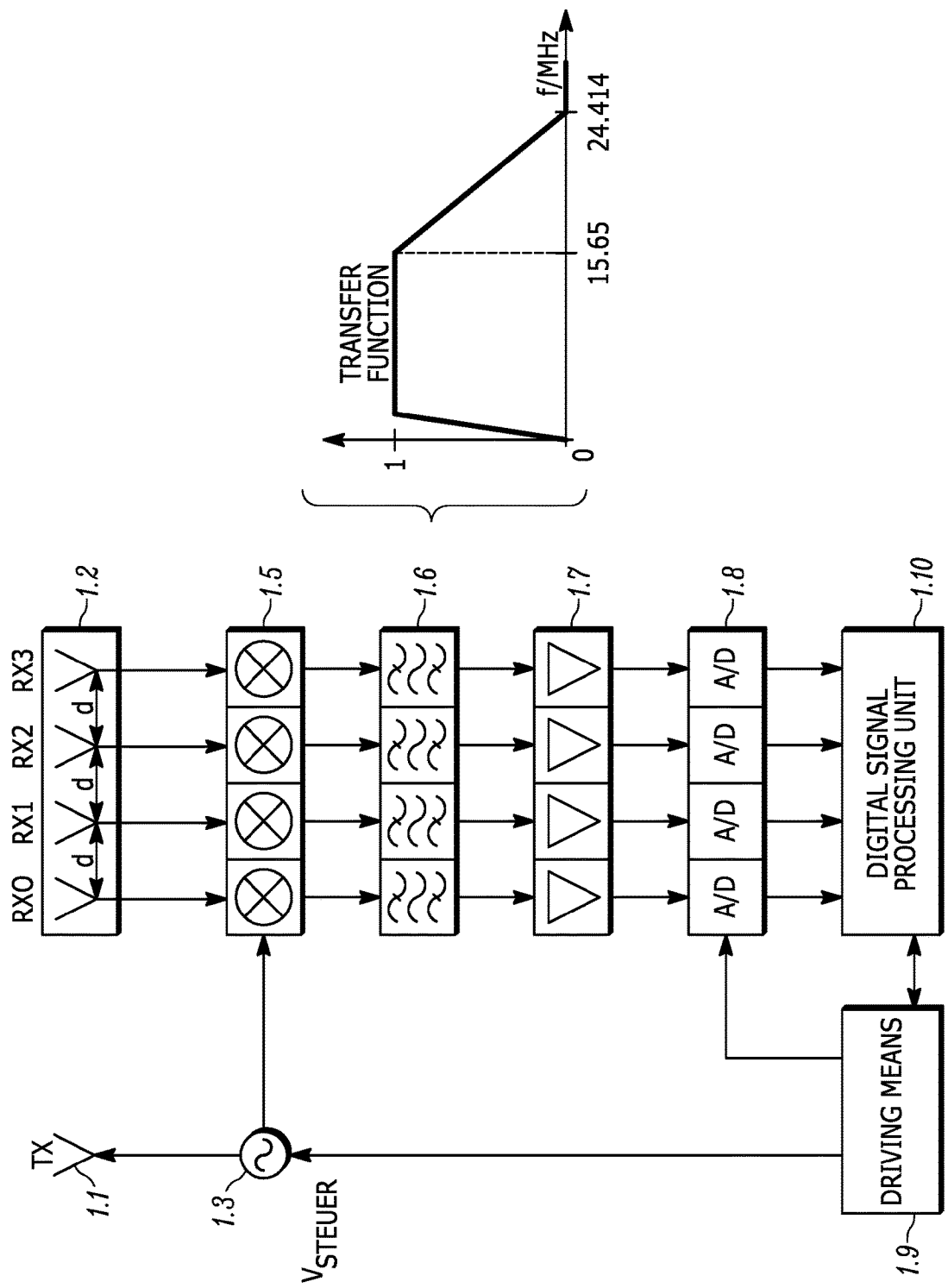
FIG. 1 shows the embodiment of the radar system which is considered by way of an example.

The first exemplary embodiment is the radar system that is roughly illustrated in FIG. 1. The radar system has a transmitting antenna 1.1 for the radiation of transmitting signals and a plurality of receiving antennas, in particular four receiving antennas 1.2 as illustrated, for the simultaneous reception of transmitting signals that are reflected from objects. All antennas (transmitting and receiving antennas) have the same beam shape with respect to elevation and azimuth. The plurality of receiving antennas are located in the same plane, and each of them has the same lateral, i.e. horizontal, spacing d.

The transmitting signals are obtained from the high-frequency oscillator 1.3 in the GHz range, in particular in the 24-GHz range. The frequency of the oscillator 1.3 can be changed by means of a driving voltage $v_{Steuer}$; the driving voltage is generated in the driving means 1.9. The signals received by the antennas are mixed down to the low-frequency range in the real-valued mixers 1.5 also with the signal of the oscillator 1.3. After that, each of the receiving signals passes a band-pass filter 1.6 with the transfer function shown, an amplifier 1.7 and an A/D converter 1.8, followed by further processing thereof in a digital signal processing unit 1.10.

Figure 2:
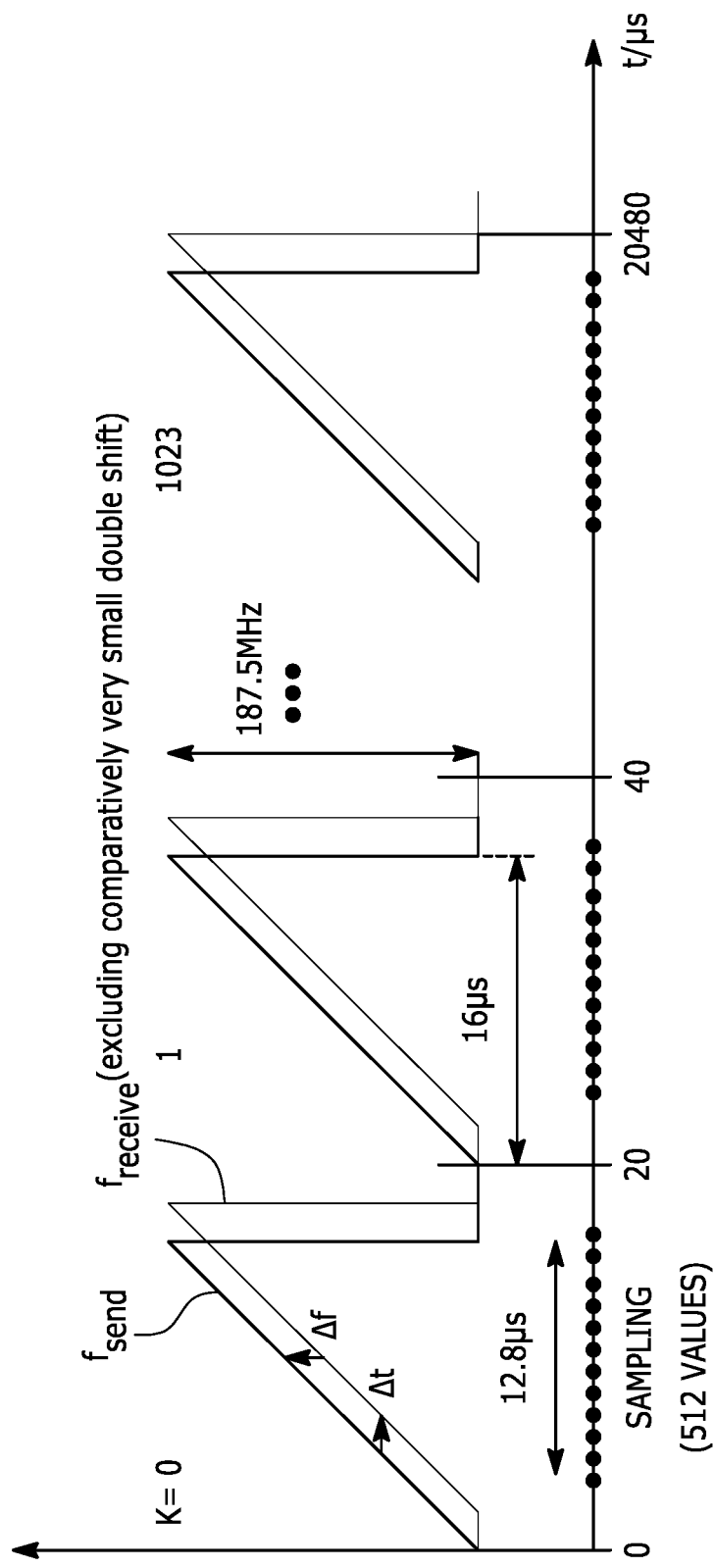
FIG. 2 shows the frequency of the transmitting and receiving signals that consists of so-called frequency ramps.

In order to be able to measure the range from objects—as illustrated in FIG. 2—the frequency of the high-frequency oscillator and thus of the transmitting signals is linearly changed very quickly (e.g. by 187.5 MHz within 16 μs); this is called a frequency ramp. The frequency ramps are repeated periodically (e.g. every 20 μs), which means that there are a total of e.g. 1024 frequency ramps.

The receiving signal of an individual object is, after mixing and thus also at the A/D converter, a sinusoidal oscillation for each frequency ramp and for each of the plurality of receiving channels; this can be explained by means of FIG. 2 as follows: If the object has a radial relative velocity of zero relative to the radar system, the frequency difference $\Delta f$ between the transmitted signal and the received signal is constant and proportional to the signal propagation time $\Delta t$ and thus proportional to the radial range $\Delta r = c \cdot \Delta t/2$, wherein c is the velocity of light and the factor ½ takes into account the fact that the propagation time $\Delta t$ refers to the outward travel and return travel of the wave; the frequency difference $\Delta f$ is $\Delta f = 2r/c \cdot 187.5$ MHz/16 μs=r·78.125 kHz/m in the above numerical example. Since the received signal is mixed in each receiving channel with the oscillator frequency and thus the transmitting frequency, there is one sinusoidal oscillation each after the mixer, said oscillation having the frequency $\Delta f$. This frequency is in the MHz range, and it is shifted by the Doppler frequency when there is a non-imperceptible (radial) relative velocity. However, the Doppler frequency is in the kHz range only and is therefore approximately negligible as against the frequency component by the object range. If there are several objects, the receiving signal consists of several superimposed sinusoidal oscillations of different frequencies.

The receiving signals at the A/D converter are sampled, e.g. 512 times at an interval of e.g. 25 ns each (i.e. with 40 MHz) during each frequency ramp in all of the receiving channels (see FIG. 2). FIG. 2 shows that signal sampling is only useful in that time range in which receiving signals from objects in the interesting range arrive, i.e. at least the propagation time that corresponds to the maximally interesting range must pass after the start of the ramp (i.e. 1.25 µs at a maximum range of 200 m).

Figure 3:
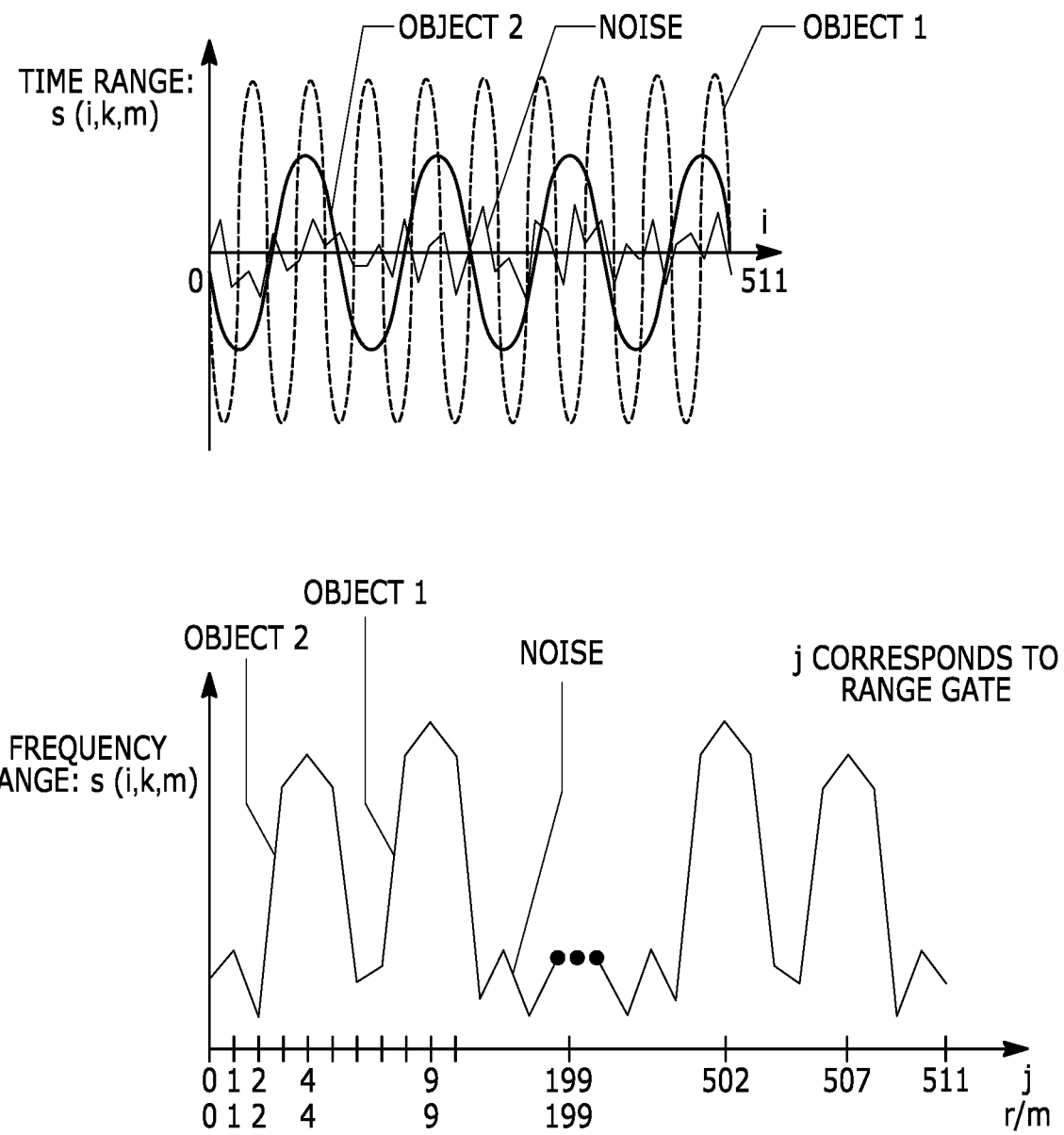
FIG. 3 shows a sampled signal in the presence of two objects prior to the first DFT (left) and after the first DFT (right).

After that, a discrete Fourier transform (DFT) in the form of a fast Fourier transform (FFT) is formed over the e.g. 512 sampled values of each frequency ramp and of each receiving channel, whereby objects in different ranges resulting in different frequencies can be separated (see FIG. 3: signal prior to DFT in the presence of two objects (left) and after DFT (right), wherein k is the control variable over the e.g. 1024 frequency ramps and m is the control variable over the plurality of receiving channels RXm). Each of the discrete frequency control points j of the DFT corresponds to a range r and can therefore also be called a "range gate" (by analogy with pulse radar). In the design mentioned above, the range gates have an interspace and thus a width of e.g. one meter (results with the above numerical examples from r·78.125 kHz/m=1/(12.8 µs)). In the DFT, power peaks occur in the range gates in which objects are present. Since the sampled receiving signals are real-valued and the upper transition region of the analog band-pass filters 1.5 has a frequency bandwidth of e.g. 8.764 MHz (corresponds to the range of 112 frequency control points), only e.g. 200 of the 512 discrete frequency control points can be further processed. Note that filter transition regions cannot have any desired narrowness. The filters 1.5 damp small frequencies and thus the receiving signals from close objects in order to avoid the overdriving of the amplifiers 1.6 and the A/D converters 1.7 (the intensity of the signals received at the antennas increases with decreasing object range).

Figure 4:
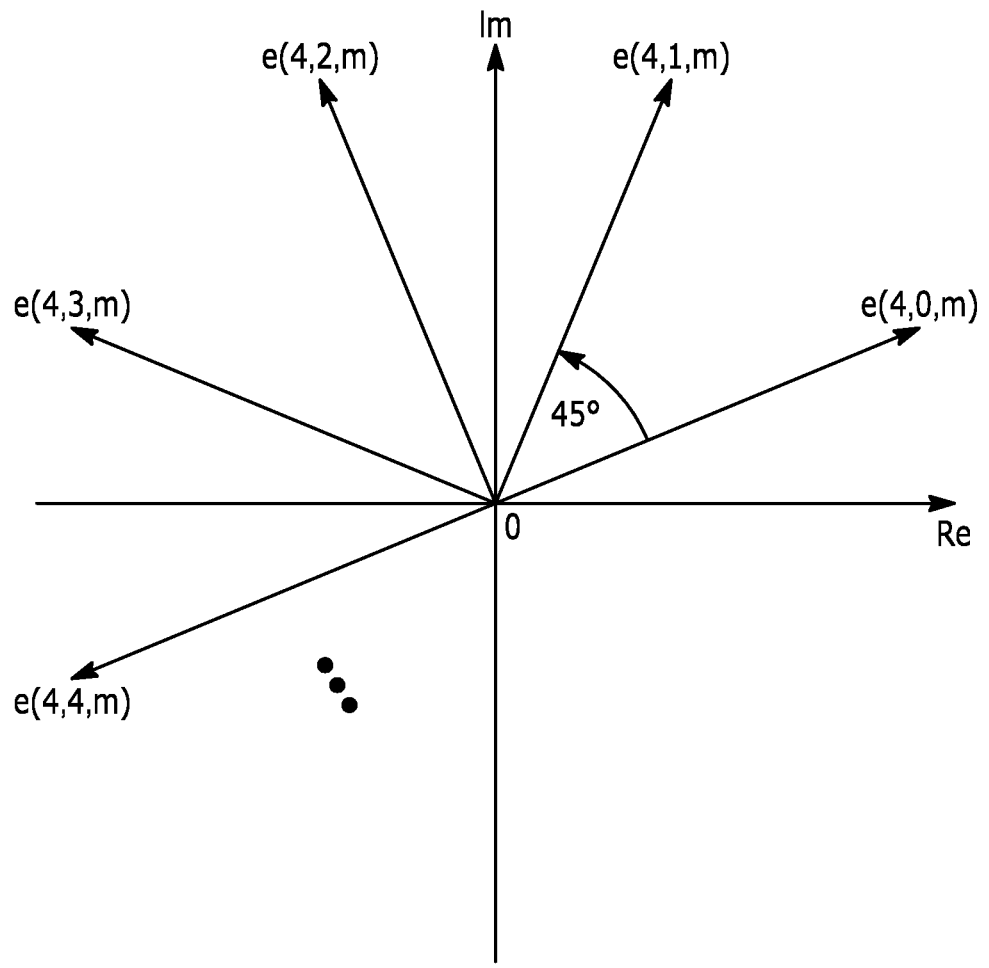
FIG. 4 shows the complex spectral value in range gate 4 in which exactly one object is present, said complex spectral value rotating over the frequency ramps.

Complex spectral values e (j,k,m) occur over the e.g. 1024 frequency ramps (k=0, 1, ... , 1023) in each receiving channel m (m=0, 1, 2, 3) for each range gate j (i.e. each of the e.g. 200 considered frequency control points). If there is exactly one object at the range that corresponds to a range gate, the complex spectral value in this range gate j rotates over the e.g. 1024 frequency ramps at the Doppler frequency since the range (in the mm range or below that) and thus the phase position of the associated oscillation uniformly changes from frequency ramp to frequency ramp (see FIG. 4; the phase change of 45° for each frequency ramp corresponds to a range change of the object of $\lambda/(8\cdot2)=0.78$ mm, wherein the wavelength is $\lambda=c/24.15$ GHz=12.4 mm and the factor 2 in the denominator takes the outward travel and return travel of the waves into consideration, from which the relative velocity $v_{rel}$=0.78 mm/20 µs=140 km/h results). Several objects of different relative velocities in the same range gate are separated by forming, for each receiving channel and each range gate, a second DFT over the complex spectral values occurring in the e.g. 1024 frequency ramps. Each of the discrete frequency control points I of this second DFT corresponds to a set of Doppler frequencies (due to the sampling of the Doppler frequency, it can only be determined down to an unknown integral multiple of its sampling frequency) and thus a set of relative velocities $v_{rel}$ of objects so that the discrete frequency control points of the second DFT can be called "relative-velocity gates". In the exemplary design considered herein, the set of possible relative velocities always includes only one relative velocity that is useful or possible with respect to road traffic—see FIG. 5). The second DFT is not only used for determining the relative velocity but also increases detection sensitivity (by about $10\cdot\log_{10}(1024)$=30 dB if there are 1024 frequency ramps) because of its integration.

Figure 5:
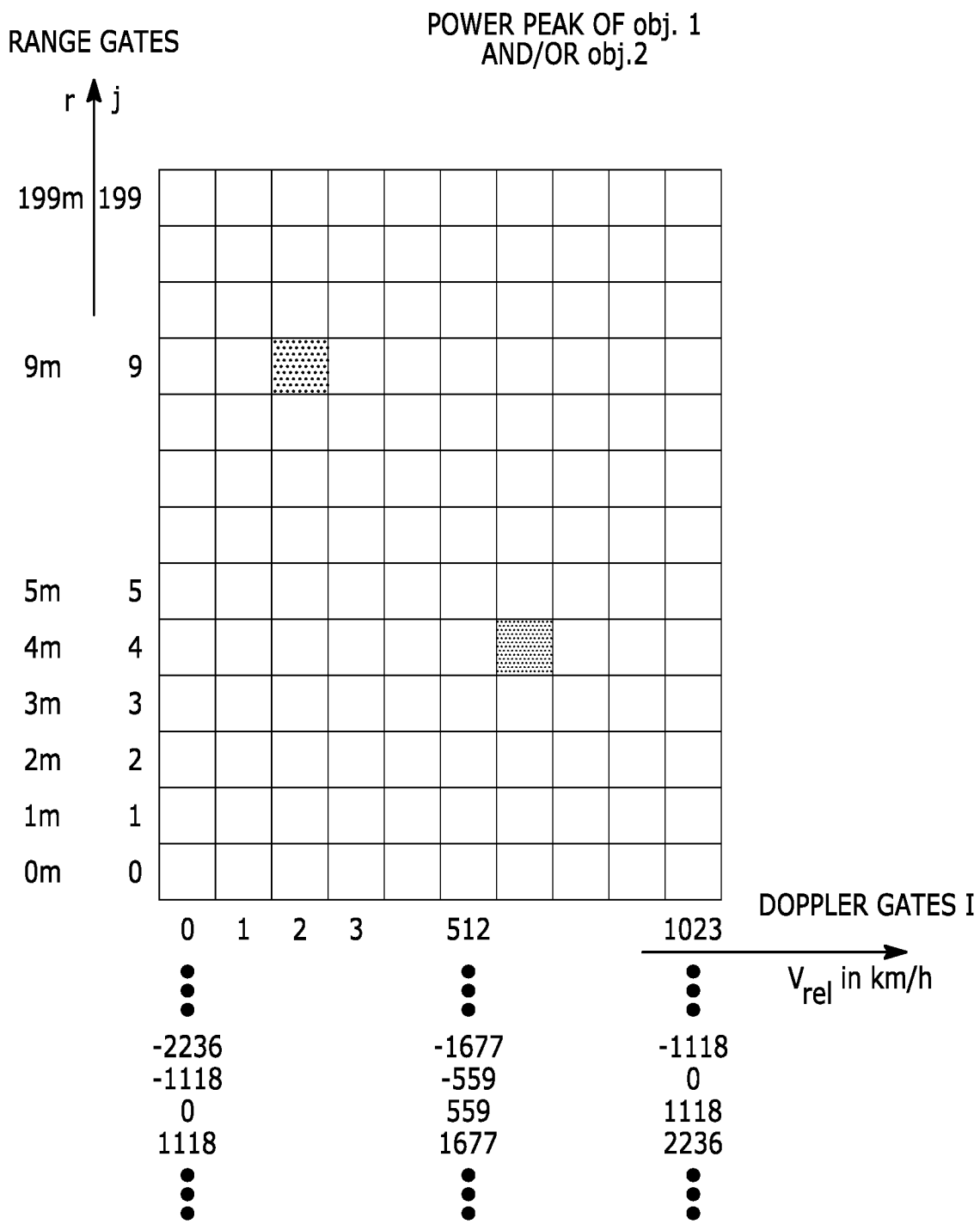
FIG. 5 shows the two-dimensional complex-valued spectrum after the second DFT.

The result of this second DFT for the relative velocities is a two-dimensional complex-valued spectrum for each receiving channel, wherein the individual cells can be called "range-relative-velocity gates" and power peaks caused by objects occur at the respective associated range-relative-velocity gate (see FIG. 5).

Figure 6:
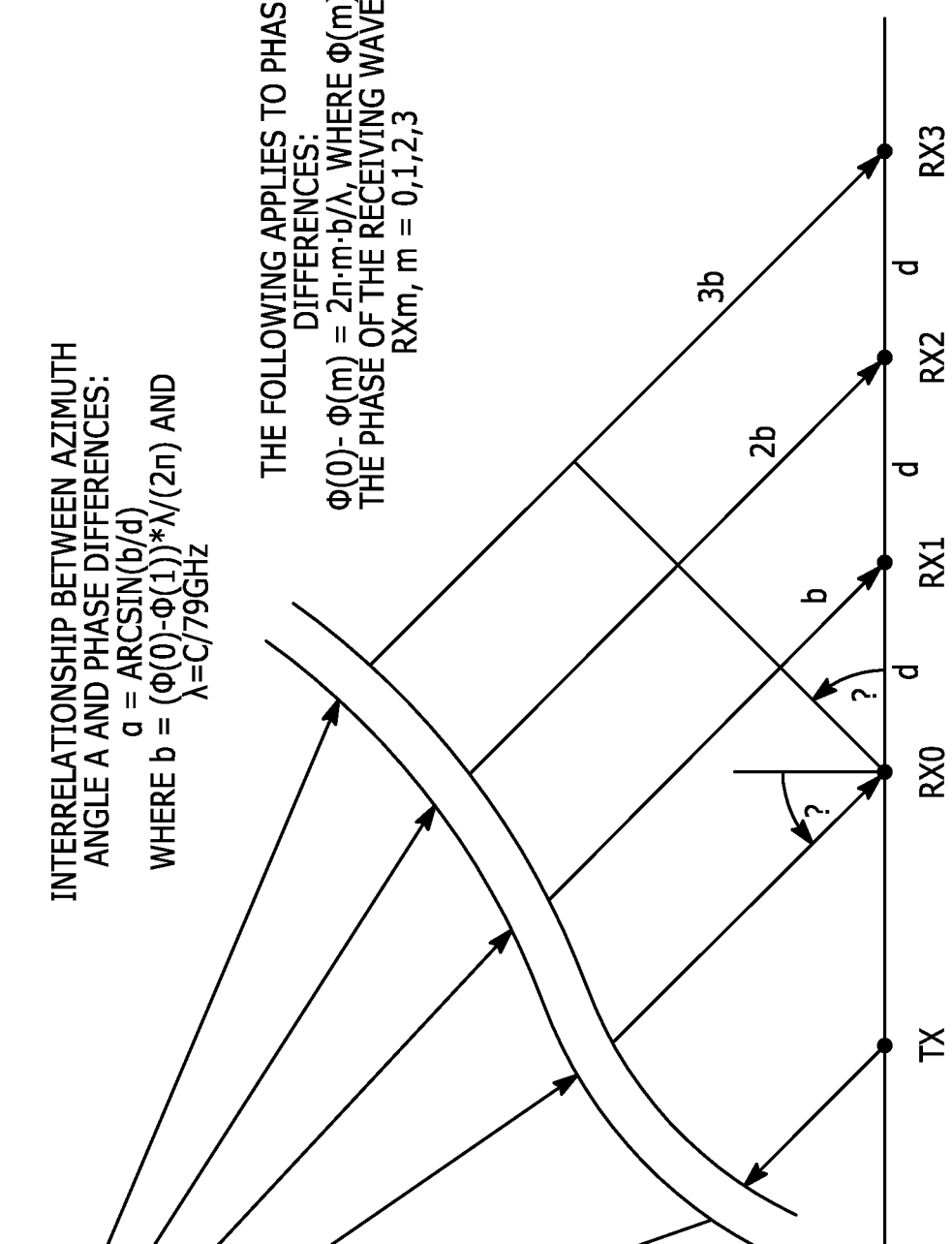
FIG. 6 explains the different phase positions at the four receiving antennas and their interrelationship with the azimuth angle.

Finally, the information from the plurality of receiving channels (to the plurality of receiving antennas) is merged. The wave radiated by the transmitting antenna and reflected from an individual object arrives at the e.g. four receiving antennas m, m=0, 1, 2, 3, with different phase positions $\varphi(m)$ in dependence on the azimuth angle $\alpha$ since the ranges between the object and the receiving antennas are slightly different. Due to the horizontal equidistance of the receiving antennas, the phase differences linearly increase/decrease over the four receiving antennas (see FIG. 6). Aside from any constant and thus compensatable phase shifts, these phase differences continue to exist until after the second DFT so that digital beam shaping can be performed in each range-relative-velocity gate via the four receiving channels. For this purpose, sums are formed over the complex values of the four receiving channels, and each of them is multiplied by a set of complex factors with a linearly increasing phase. In dependence on the linear phase change of the respective set of factors, radiation lobes with different beam directions are formed. The beam width of these radiation lobes is considerably smaller than that of the individual receiving antennas. The summation described above is realized by e.g. an 8-point DFT, wherein the e.g. four values of the e.g. four receiving channels are filled with four zeros. The discrete frequency values of this DFT correspond to different azimuth angles and can therefore be called "angle gates" n (e.g. n=0, 1, . . . 7).

Figure 7:
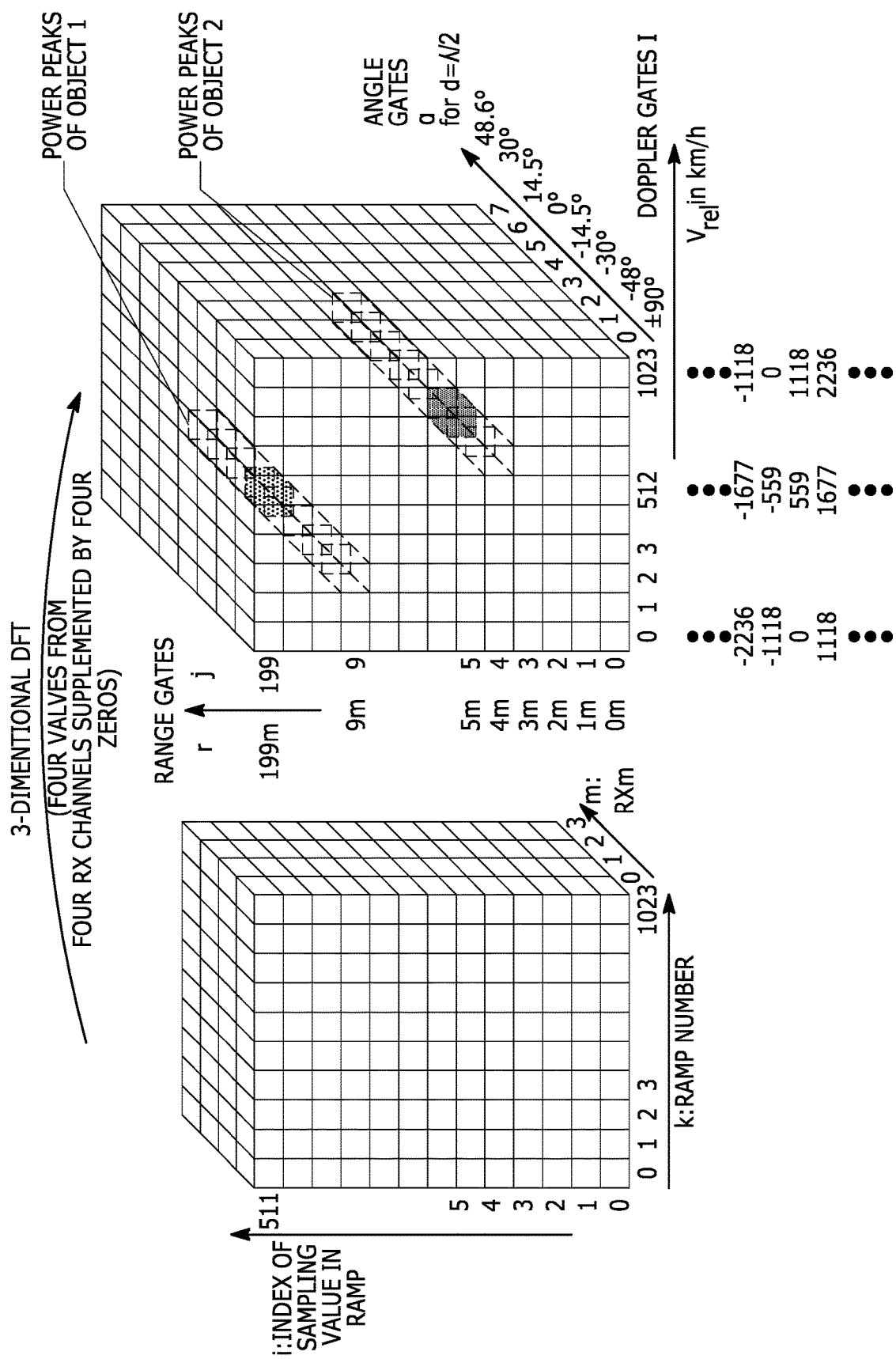
FIG. 7 shows the data prior to the three-dimensional DFT (left) and the three-dimensional complex-valued spectrum thereafter (right).

The result of this third DFT for the azimuth angles is a three-dimensional complex-valued spectrum, wherein the individual cells can be called "range-relative-velocity-angle gates" and power peaks caused by objects occur at the respective associated range-relative-velocity-angle gate (see FIG. 7: data prior to three-dimensional DFT (left) and thereafter (right)), i.e. the determination of the power peaks enables objects to be detected and the object quantities "range", "relative velocity" (aside from any ambiguities, see above) and "azimuth angle" to be determined. Since power peaks still have levels even in adjacent cells on account of the DFT windowing, the object quantities can be determined much more precisely than the gate widths by interpolation in dependence on these levels. Note that the window functions of the three discrete Fourier transforms (DFTs) are selected such that, on the one hand, the power peaks do not become too broad (in order to achieve sufficient object separation) but, on the other hand, the secondary lobes of the window spectra do not become too high (in order to be able to detect also weakly reflective objects in the presence of highly reflective objects). As a fourth object quantity, the reflection cross-section of the object can be estimated from the height of the power peaks. The reflection cross-section indicates the intensity of the reflection of the radar waves from the object. The described detection of objects and the determination of the associated object quantities represent a measuring cycle and provide an instantaneous image of the surroundings, which is cyclically repeated, e.g. approximately every 30 ms.

The advantage of the method described above is a high resolution capability—and thus object separability, since the measured variables range, relative velocity and azimuth angle are, on the one hand, determined independently of one another and, on the other hand, at a high resolution. A disadvantage is the fact that large volumes of data have to be processed, which requires high computing and storage capacity. The ongoing further developments in semiconductor technology are resulting in reductions in the costs of computing capacity more rapidly than for storage capacity due to higher cycles and more intelligent implementations. It is therefore very important that the method described above is designed optimally with respect to the storage requirements.

Prior to calculating the second and third DFT for the relative velocities and azimuth angles, the first DFT for the e.g. 200 range gates must have been determined for all e.g. 1024 frequency ramps and e.g. 4 receiving channels. The digital signal processing unit 1.10 used in this example calculates in 32-bit fixed-point arithmetic in a two's complement representation. 8 bytes are therefore required for each complex-valued value (2 times 32 bits, where 1 byte=8 bits). 1024×4×200×8=6,553,600 bytes of data therefore occur over the e.g. 1024 frequency ramps, e.g. 4 receiving channels and e.g. 200 range gates. The memory required for this would result in costs of several euros.

This is why the data is compressed after the first DFT for the range measurement. To this end, the results of the first DFT are introduced into a so-called pseudo floating-point representation which is explained below:

E.g. 8 real-valued numbers with 32 bits (4 real parts and 4 imaginary parts—the values after the first DFT are of course complex-valued) occur for each frequency ramp after the first DFT in each range gate over the e.g. 4 receiving channels. By means of these e.g. 8 32-bit fixed point values in arithmetic with two's complement, it is then determined in each case how many bits after the most significant bit have the same value as said MSB before a bit with a different value comes for the first time (Most Significant Bit=MSB and carries the algebraic sign information in a two's complement representation): for the example 11111110101110000000010000010111 there are a total of a further 6 ones following the MSB which has the value one, before the first zero comes. The minimum is determined from these 8 numbers of following bits of the same value as the MSB, which is called a block shift. In the following example of 8 32-bit numbers:

```
11111110101110000000010000010111
11111111101001010001011101000101
00000000101010000101000100010010
11111011100010101000001000010001
00000101010100000111101010101010
11111111010101000000101010010100
00000000100001010010100001001010
11111010100101000010100100000001
``` there is therefore a block shift of 4 (of the fourth and fifth number, wherein there are only 4 bits with the same value as the MSB after the MSB). This block shift is encoded in binary form into 8 bits, i.e. in the example above as 00000100.

For each of the 32-bit numbers, the first block shift (i.e. 4 bits in the above example) is deleted and the next 7 bits are extracted, which can also be called the mantissa; If the block shift is greater than 25, the 32-bit numbers coming behind are still to be expanded by zeros. These 8 mantissas of 7 bits each are appended to the 8 bits of the block shift, as a result of which a 64-bit value is obtained in a so-called pseudo floating-point representation; in the example above the following is obtained (the points are used to separate the numbers in order to better visualize the individual portions):

00000100.1110101.1111110.0000101.1011100.0101010. 1111010.0000100.1101010

This process thus constitutes a uniform scaling of the 8 values to the block shift and a quantization of the scaled values to 7 bits.

Note that 5 bits would be sufficient for representing the block shift of 32-bit numbers; it was only "expanded" to 8 bits in the above example, in order to arrive at 64 bits in total, since bit numbers used in memories are usually powers of two. These three unused bits could of course also be inserted elsewhere.

In order to require as few bits as possible for the compressed values, the same block shift has been used for all 4 complex channel values, i.e. the same scaling for the pseudo floating-point representation. Since all of the receiving channels see the same objects, they have the same level at least in situations where there is only one object in the respective range gate, so that due to the same scaling of all receiving channels, no or at most only one slightly higher quantization error is generated than if separate scaling values are retained for the e.g. 4 complex receiving channel values or the 8 real-valued portions thereof in total (real and imaginary parts). The above statement that the receiving channels have the same level at least in situations with only one object in the respective range gate only applies, if they have the same sensitivity. If the analog parts of the receiving channels have a different sensitivity (e.g. because the lines between receiving antennas and mixers are of different lengths), this can be compensated for in the digital signal processing e.g. before the first DFT by multiplication by different factors.

The compressing described above of the e.g. 4 complex receiving channel values to 64 bits is carried out for each of the e.g. 1024 frequency ramps and each of the e.g. 200 range gates. Therefore only 1,638,400 bytes of memory is required, which represents a reduction of 75%.

After the first FFT has been determined over all frequency ramps and the results have been stored as illustrated above in a compressed pseudo floating-point representation, the second and third DFT for the relative velocities and azimuth angles are successively calculated for each range gate and the power peaks are determined and stored by means of these two dimensions.

Since these calculations are again carried out in 32-bit fixed-point arithmetic in a two's complement representation, the data compressed after the first DFT has to be "unpacked" again, i.e. decompressed, which is described below:

The data of the e.g. 1024 frequency ramps which is compressed to 64 bits in each case is read out successively for the respective range gate. These 64-bit numbers contain the 4 real and 4 imaginary parts of the 4 receiving channels as 7-bit mantissas and have a joint 8-bit block shift. In order to form 32-bit fixed point values from this, the most significant bit thereof is added block shift-times (i.e. 4-times in the above example) before the mantissas and is filled up with zeros behind the mantissa to 32 bits; If the block shift is greater than 25, the rear bits of the mantissa are omitted (which are zeros in any case). In the above example, the following 8 real-valued 32-bit numbers are obtained (the points visualize the position of the mantissa):

```
1111.1110101.00000000000000000000
1111.1111110.00000000000000000000
0000.0000101.00000000000000000000
1111.1011100.00000000000000000000
0000.0101010.00000000000000000000
1111.1111010.00000000000000000000
0000.0000100.00000000000000000000
1111.1101010.00000000000000000000
```

The first 11 bits of the values are identical to the original values, the following 21 bits are set to zero and are therefore different to the original values.

The method described determines the power peaks first by means of the dimensions relative velocity and azimuth angle, i.e. for each range gate, and stores these. After power peaks have been formed and stored in this way over all range gates, the power peaks are finally determined in a concluding step by means of the third dimension range.

The memory required for the intermediate storage of the power peaks for each range gate is much lower than the memory required for the results after the first DFT, because there are a maximum of a few hundred reflection points. The main storage load in the case of the radar method described here is therefore imposed by the data after the first DFT, the scope of which could be reduced by the compensation mechanism described by 75%.

During the compressing the information content of the bits truncated behind the mantissa is lost. An error is therefore made due to this quantization. In the case of the approach described above, it is simply truncated, i.e. not rounded. As a result, an error of half of the least significant bit (LSB) of the mantissa is made on average.

This average error can be avoided by rounding instead of truncating. Rounding can be effected by adding a value corresponding to half of the mantissa LSB prior to truncation, thus in the example above (the points visualize the position of the mantissa):

0000.0000000.10000000000000000000

Based on one range gate in each case, the errors which are made by the quantization during the compressing, over all of the frequency ramps, are typically approximately the same size. The reason for this is that in one range gate, the same objects are of course detected over all frequency ramps which last a total of 20.48 ms (provided that their relative velocity is not extremely high) and their level scarcely alters during this time, so that the block shift in one range gate is approximately the same size over all of the frequency ramps. If the quantization error is random over the frequency ramps, i.e. it is uncorrelated, it is not coherently integrated in the second DFT over the e.g. 1024 frequency ramps; as a result, the spacing of the signal power from the quantization noise power after the second DFT increases by e.g. $10 \cdot \log_{10}(1024) = 30$ dB. In the case of the third DFT a further e.g. $10 \cdot \log_{10}(4) = 6$ dB is obtained over the four receiving channels, if the quantization error is uncorrelated over the receiving channels.

The dynamic range of the quantization of the compressing is therefore increased by 6 bits (1 bit corresponds to 6 dB; a total integration gain of 36 dB), i.e. 6 bits are again added to the 7 bits of the mantissa over the integration gain of the second and third DFT.

This dynamic range of roughly 13 bits within a range gate based on the strongest object there is more than sufficient, as a highly reflective object reduces the dynamic range in the same range gate anyway due to non-ideal hardware properties (such as e.g. phase noise of the oscillator) and other signal processing artifacts (such as ancillary lobes of the spectra of the window functions of the DFT) and can thus make extremely weakly reflective objects invisible.

Based on all ranges, a greater dynamic range is of course required, in particular since close objects have a much greater level than distant objects. However, the quantization of the compressing does not oppose this, as it only limits the dynamic range quasi adaptively within one range gate in each case.

For this reason and because of the integration gain of the second and third DFT, the length of the mantissa during the compressing can be kept much smaller than the length of number (32 bits here) used during the calculation of the three DFTs and can thus save storage capacity.

As has already been mentioned in a restrictive manner above, the integration gain of the second and third DFTs is only achieved for the quantization noise of the compressing, if the quantization noise is uncorrelated across the frequency ramps and receiving channels (it does not need to be across the range gates). If—as happens in the case of large reflections—the quantization noise then exceeds the system noise due to the hardware (noise of the analog parts), then this non-correlation generally does not exist, which could e.g. lead to non-real power peaks after the three-dimensional DFT, i.e. ultimately to so-called ghost detections in the radar image. It is therefore advantageous to add up so much noise prior to quantization (i.e. extracting of the mantissa) that non-correlation is intrinsically guaranteed. To do this, a random number which extends beyond the subsequently truncated bits is added in each case; it therefore assumes a random value of interval [0, mantissa LSB]. This random number is uncorrelated across the frequency ramps and receiving channels, it can be the same across the range gates. In the above example, we will now consider the first of the 8 real-valued numbers to which a corresponding random value is added prior to extracting the mantissa (the points visualize the position of the mantissa):

```
  1111.1110101.11000000001000001 0111
+        1010111001000101 0000
  ─────────────────────────────────
  1111.1110110.01101111010000 1100111
```

The mantissa therefore changes from 1110101 to 1110110.

By adding a random number in this way (in the same way as adding a half mantissa LSB for rounding instead of truncating described above), this could result in an overflow of the mantissa (for mantissa 0111111), i.e. the most significant bit of the mantissa is no longer equal to the most significant bit of the original number, so that the block shift is lowered. This case is to be intercepted accordingly, e.g. by proactively lowering the block shift by one in the presence of an original mantissa 0111111.

Note that the length of the added random number can be reduced, e.g. to 8 bits, since the quantization errors are still sufficiently uncorrelated.

Finally it should be mentioned that the data compressing explained above can of course also be transferred to other system architectures and/or can be implemented with alternative forms; a few examples are indicated here:

up to now, parallel capturing of the data of all e.g. 4 receiving channels has been considered; in order to reduce the necessary hardware, a multiplexer can also be inserted after the mixers, so that the low-frequency part of the receivers only has to be realized once up to and including the A/D converter instead of four times; only the data of one receiving channel in each case is then captured alternately for each frequency ramp: in the case of frequency ramps 1,5,9, . . . for receiving channel 1, in the case of frequency ramps 2,6,10, . . . for channel 2, . . . ; the data of four successive frequency ramps respectively is summarized for each range gate for the four receiving channels, i.e. data of the frequency ramp groups 1-4, 5-9, the serial data acquisition of receiving channels just described can also be similarly transferred to a radar system having one receiving antenna and several transmitting antennas; in addition, the compressing can also be applied to data captured in a parallel manner over several receiving antennas and in a serial manner over several transmitting antennas, the quantization errors of the compressing are generally small enough for a significantly lower mantissa length as well; e.g. in the case of 16-bit signal processing and in the case of 6 receiving channels, a 64-bit compressing with a 4-bit block shift and 5-bit mantissa length can be implemented for the 12 real and imaginary parts together, even if the signal processing operates with more than 16 bits (e.g. with 24 bits), a 4-bit block shift can be used, since the first DFT still does not normally require the full dynamics of the signal processing (full dynamics are only required due to the additional signal processing gain of the second and third DFTs); the block shift is then to be limited to a maximum of 15, in particular, in order to reach a bit number equal to a power of two for the block shift and the mantissas together (this is how memories are usually designed), it may be sensible to not make all of the mantissas the same length; e.g. in the case of 16-bit signal processing and in the case of 4 receiving channels, a 32-bit compressing with a 4-bit block shift, 4-bit mantissa length for the 4 real parts and 3-bit mantissa length can be achieved for the 4 imaginary parts, up to now it has been considered that the data of the receiving channels are compressed together in each case for one range gate—i.e. with the same scaling; however the same scaling could also be used for several range gates, in particular two adjacent range gates, since their level is generally not very different (due to slurring of the spectrum by the window function) and because it is especially important for the further processing that the range gates having one power peak (i.e. one relative maximum) have a low relative quantization error; therefore 8 complex values are compressed together in the case of four receiving channels and joint scaling of two successive range gates, data compressing of the stored values after the first DFT can also be used for a version of the signal processing (in particular of the DFTs) in floating-point arithmetic.

Examples of the compressing and decompressing with the aid of MATLAB scripts (MATLAB is a mathematical technical programming language) are provided in the annex; compressing and decompressing are also explained in detail by relevant comments in these scripts.

The invention described above here and in the annex is used in a processor for a radar system. To this end, the compressing/decompressing is e.g. either implemented directly in the hardware (e.g. hard cast in silicone) or a source code with the method according to the invention is stored on this processor. The invention is therefore claimed as a method and device for a radar system.

The invention claimed is:

1. A radar system for covering the surroundings of a motor vehicle, said radar system comprising:

one or more transmitting antennas for radiation of transmitting signals, one or more receiving antennas for the reception of transmitting signals reflected off objects, and a digital signal processing unit for processing the received signals, said digital signal processing unit configured to modulate the frequency of the radiated transmitting power such that the frequency of the radiated transmitting power includes a sequence of linear ramps of identical slope, mix the signals of several combinations of transmitting and receiving antennas with an oscillator signal and sampling for each frequency ramp in a parallel manner and/or over a plurality of successive frequency ramps in each case, referred to a frequency ramp group, in a serial manner, perform a first spectral analysis with a discrete Fourier transform (DFT) in each case over the sampled values for each frequency ramp and for each of the respective combinations of transmitting and receiving antennas, store the results of this first spectral analysis over the plurality of frequency ramps for at least a part of its frequency control points, which constitute range gates, perform a second spectral analysis with a DFT over the stored values for each range gate and for each combination of transmitting and receiving antenna over the frequency ramps and/or frequency ramp groups, process the results of the second spectral analysis over the different combinations of transmitting and receiving antennas with digital beam shaping utilizing a third DFT, and storing the results of the first spectral analysis in a compressed form in order to reduce the storage space, wherein the results of several combinations of transmitting and receiving antenna have the same scaling for each range gate and frequency ramp and/or frequency ramp group, the values thus scaled are quantized to a lower bit number than that used in the signal processing and are stored with this reduced bit number, and these compressed values are decompressed again prior to the second spectral analysis.

2. The radar system according to claim 1, wherein said digital signal processing unit is further configured to operate the spectral analyses in fixed-point arithmetic with a two's complement representation.

3. The radar system according to claim 2, wherein the joint scaling of values from the minimum number of bits thereof having the same value in each case as the most significant bit is determined, and the number of front bits thus determined is deleted for scaling.

4. The radar system according to claim 1, wherein the joint scaling of the values as well as the scaled values and the values quantized to a lower bit number are encoded in a joint binary word, the bit count of which is a power of two.

5. The radar system according to claim 1, wherein different bit numbers are used for the scaled values encoded in a joint binary word.

6. The radar system according to claim 1, wherein said digital signal processing unit is further configured to add a random number prior to quantization of the scaled values.

7. The radar system according to claim 1, wherein the results of several combinations of transmitting and receiving antenna for several adjacent range gates have the same scaling for each frequency ramp and/or frequency ramp group.

8. The radar system according to claim 1, wherein said digital signal processing unit is further configured to compensate for a different sensitivity of different combinations of transmitting and receiving antennas prior to compressing.

9. The radar system according to claim 1, wherein the discrete Fourier transforms (DFTs) are determined by means of fast Fourier transforms (FFTs).

10. A signal processing method for a radar system for covering the surroundings of a motor vehicle, the radar system including one or more transmitting antennas for the radiation of transmitting signals, one or more receiving antennas for the reception of transmitting signals reflected from objects, and a digital signal processing unit for processing the received signals, said method comprising:

modulating the frequency of the radiated transmitting power such that the radiated transmitting power includes a sequence of a plurality of linear ramps of identical slope, acquiring the receiving signals of several combinations of transmitting and receiving antennas, by mixing with an oscillator signal and sampling for each frequency ramp in a parallel manner and/or over successive frequency ramps in each case, referred to as a frequency ramp group in a serial manner, performing a first spectral analysis with a discrete Fourier transform (DFT) in each case over the sampled values for each frequency ramp and for each of the respective combinations of transmitting and receiving antennas, storing the results of this first spectral analysis over the plurality of frequency ramps for at least a part of its frequency control points, which constitute range gates, performing a second spectral analysis with a DFT over the stored values for each range gate and for each combination of transmitting and receiving antennas over the frequency ramps and/or frequency ramp groups, processing the results of the second spectral analysis over the different combinations of transmitting and receiving antennas with the aid of digital beam shaping by a third DFT, storing the results of the first spectral analysis in a compressed form in order to reduce the storage space, wherein the results of several combinations of transmitting and receiving antenna have the same scaling for each range gate and frequency ramp and/or frequency ramp group, the values thus scaled are quantized to a lower bit number than that used in the spectral analyses and are stored with this reduced bit number, and these compressed values are decompressed again prior to the second spectral analysis.

11. The signal processing method for a radar system according to claim 10, further comprising operating the spectral analyses in fixed-point arithmetic with a two's complement representation.

12. The signal processing method for a radar system according to claim 11, wherein the joint scaling of values from the minimum number of bits thereof having the same value in each case as the most significant bit is determined, and the number of front bits thus determined is deleted for scaling.

13. The signal processing method for a radar system according to claim 10, wherein the joint scaling of the values as well as the scaled values and the values quantized to a lower bit number are encoded in a joint binary word, the bit count of which is a power of two.

14. The signal processing method for a radar system according to claim 10, wherein different bit numbers are used for the scaled values encoded in a joint binary word.

15. The signal processing method for a radar system according to claim 10, further comprising adding a random number prior to quantization of the scaled values.

16. The signal processing method for a radar system according to claim 10, wherein the results of several combinations of transmitting and receiving antenna for several adjacent range gates have the same scaling for each frequency ramp and/or frequency ramp group.

17. The signal processing method for a radar system according to claim 10, further comprising compensating for a different sensitivity of different combinations of transmitting and receiving antennas prior to compressing.

18. The signal processing method for a radar system according to claim 10, wherein the discrete Fourier transforms (DFTs) are determined by means of fast Fourier transforms (FFTs).

* * * * *